United States Patent
Matsumoto et al.

(10) Patent No.: US 7,557,384 B2
(45) Date of Patent: * Jul. 7, 2009

(54) SEMICONDUCTOR LIGHT EMITTING DEVICE AND SEMICONDUCTOR LIGHT EMITTING UNIT

(75) Inventors: Iwao Matsumoto, Fukuoka-ken (JP); Tatsuo Tonedachi, Fukuoka-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 218 days.

This patent is subject to a terminal disclaimer.

(21) Appl. No.: 11/390,240

(22) Filed: Mar. 28, 2006

(65) Prior Publication Data

US 2006/0220048 A1    Oct. 5, 2006

(30) Foreign Application Priority Data

Mar. 30, 2005    (JP)    ............... 2005-098970

(51) Int. Cl.
*H01L 29/22* (2006.01)
*H01L 29/24* (2006.01)

(52) U.S. Cl. ............... 257/99; 257/79; 257/98; 257/100; 257/E33.056; 257/E33.057; 438/27; 438/28; 250/200; 250/239

(58) Field of Classification Search ............... 257/98, 257/99, 100; 438/27, 28; 250/200, 239
See application file for complete search history.

(56) References Cited

U.S. PATENT DOCUMENTS 6,335,548 B1 * 1/2002 Roberts et al. ............... 257/98

| | | | |
|---|---|---|---|
| D531,140 S | 10/2006 | Konno et al. | |
| 7,291,866 B2 * | 11/2007 | Oshio et al. | 257/99 |
| 7,420,271 B2 * | 9/2008 | Hsu | 257/695 |
| 2005/0280017 A1 | 12/2005 | Oshio et al. | |

FOREIGN PATENT DOCUMENTS

JP    2005-353914    12/2005

OTHER PUBLICATIONS

U.S. Appl. No. 11/149,461, filed Jun. 10, 2005.

* cited by examiner

*Primary Examiner*—Dao H Nguyen
(74) *Attorney, Agent, or Firm*—Banner & Witcoff, Ltd

(57) ABSTRACT

In various aspects, a semiconductor light emitting device may include a mold resin having a cup shape portion on an upper surface of the mold resin; a first lead provided in the mold resin and extending from the cup shape portion to outside of the mold resin, the first lead having a first lead section and a second lead section, the second lead section of the first lead being thicker than the first lead section of the first lead, the second lead section of the first lead having a hole; a second lead provided in the mold resin and extending from the cup shape portion to outside of the mold resin, having a first lead section and a second lead section, the second lead section of the second lead being thicker than the first lead section of the second lead; a light emitting element mounted on the second section of the first lead in the cup shape portion; a wire electrically connecting the light emitting element and the second lead; and a sealing resin configured to seal the light emitting element and the wire.

20 Claims, 14 Drawing Sheets

SEMICONDUCTOR LIGHT EMITTING DEVICE AND SEMICONDUCTOR LIGHT EMITTING UNIT

CROSS REFERENCE TO RELATED APPLICATION

This application is based upon and claims the benefit of priority from Japanese Patent Application No. P2005-98970, filed on Mar. 30, 2005, the entire contents of which are incorporated herein by reference.

The entire contents of prior application U.S. Ser. No. 11/149,461, filed on Jun. 10, 2005, are incorporated herein by reference.

BACKGROUND OF THE INVENTION

Research and development of a semiconductor light emitting device is proceeding. The semiconductor light emitting devices are going to be used in various ways, such as automotive use (stop lamp, tail lamp or light in dash board), traffic signals, LED display, or back light for liquid crystal display. In the semiconductor light emitting device including those usages, the semiconductor light emitting device, which emits high luminance light driven by large current, is required. SMDs (Surface Mount Device) have an advantage in small package or high density mount.

SUMMARY

Aspects of the invention relate to an improved semiconductor light emitting device. Other aspects relate to an improved semiconductor light emitting unit.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings, wherein.

Figure 9A:
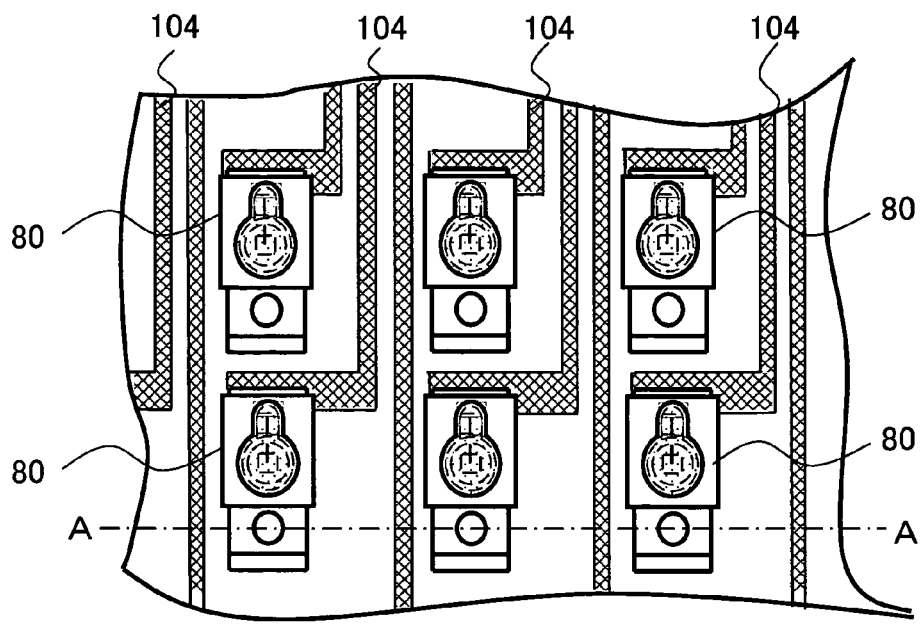
Figure 9B:
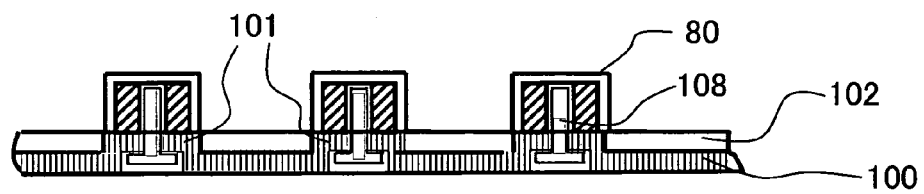
Figure 9C:
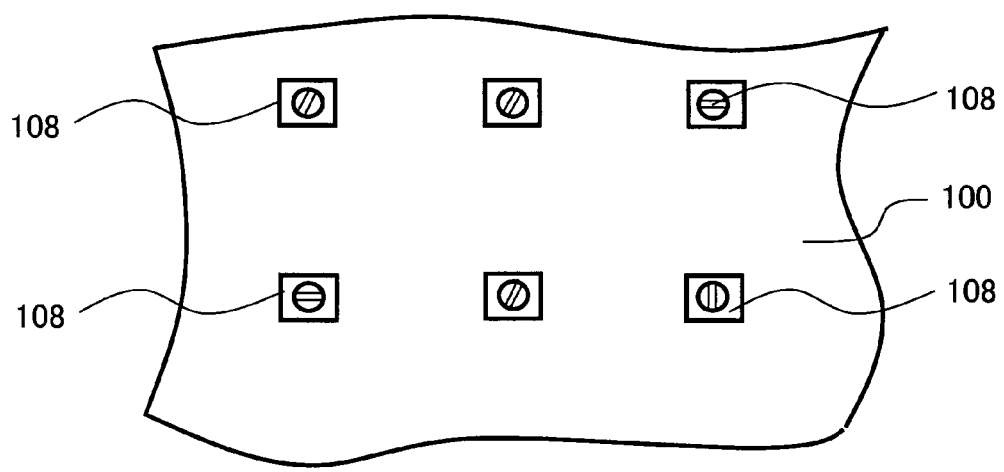

FIG. 9A is a top view of the semiconductor light emitting unit in accordance with the first embodiment. FIG. 9B is a cross sectional view of the semiconductor light emitting unit in accordance with the first embodiment. FIG. 9C is a bottom view of the semiconductor light emitting unit in accordance with the first embodiment.

Figure 10A:
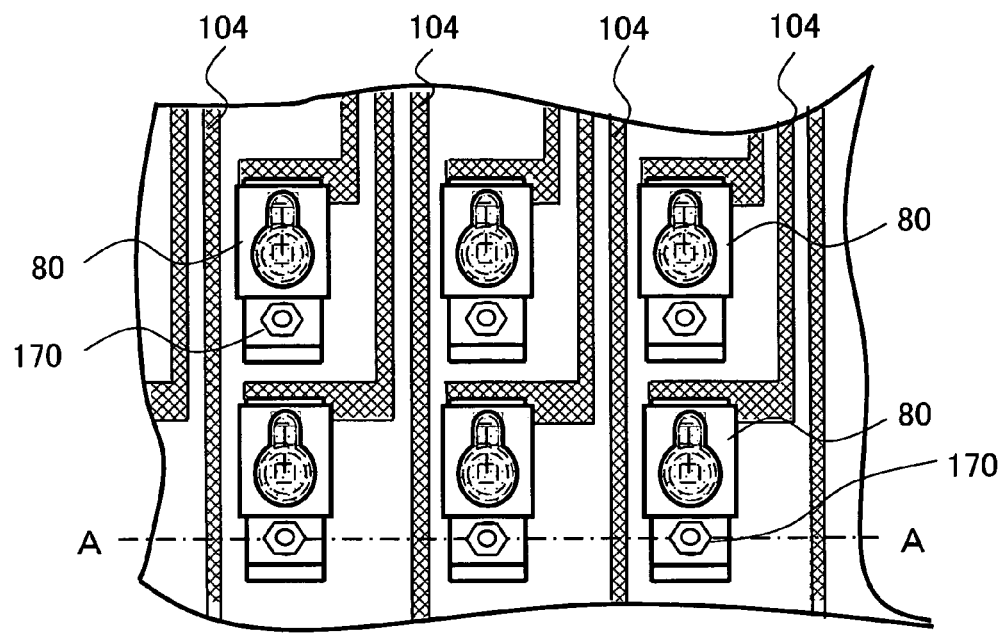
Figure 10B:
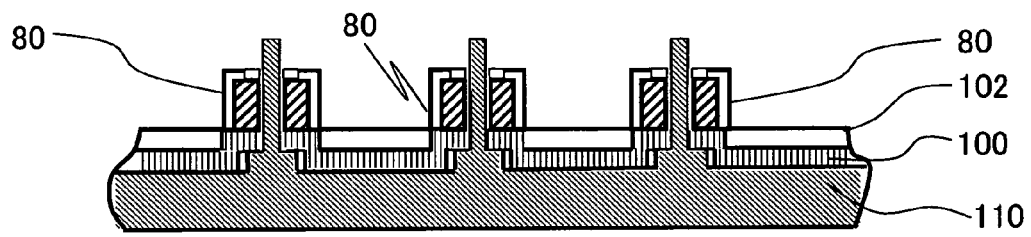
Figure 10C:
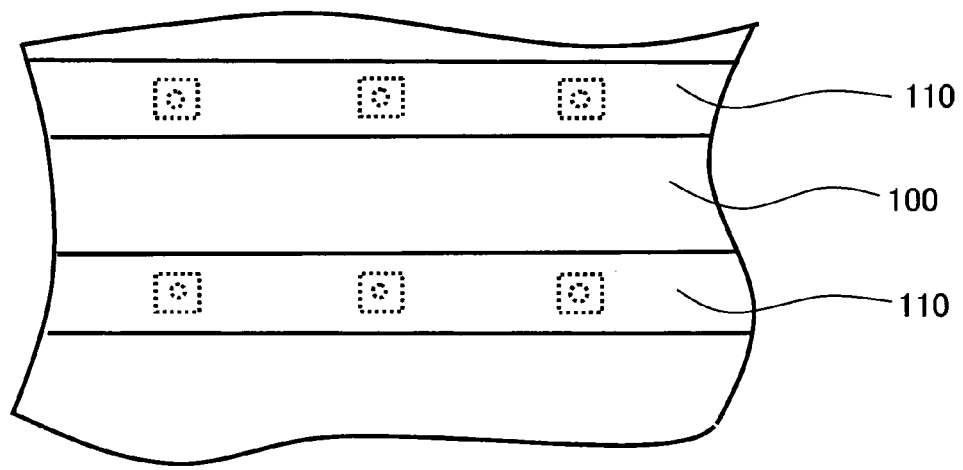

FIG. 10A is a top view of the semiconductor light emitting unit in accordance with a modification of the first embodiment. FIG. 10B is a cross sectional view of the semiconductor light emitting unit in accordance with the modification of the first embodiment. FIG. 10C is a bottom view of the semiconductor light emitting unit in accordance with the modification of the first embodiment.

Figure 11:
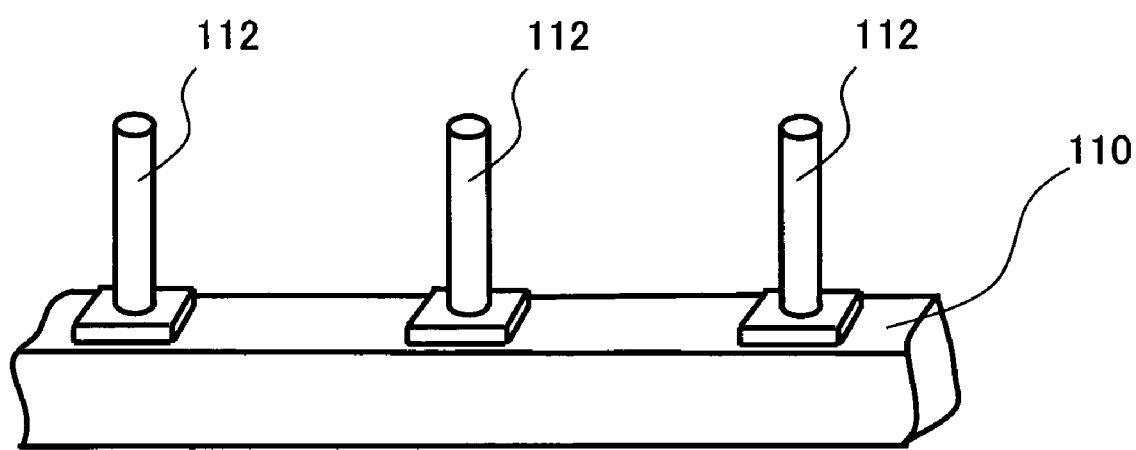

FIG. 11 is a perspective view of a fixing member 100 in accordance with the modification of the first embodiment.

Figure 12A:
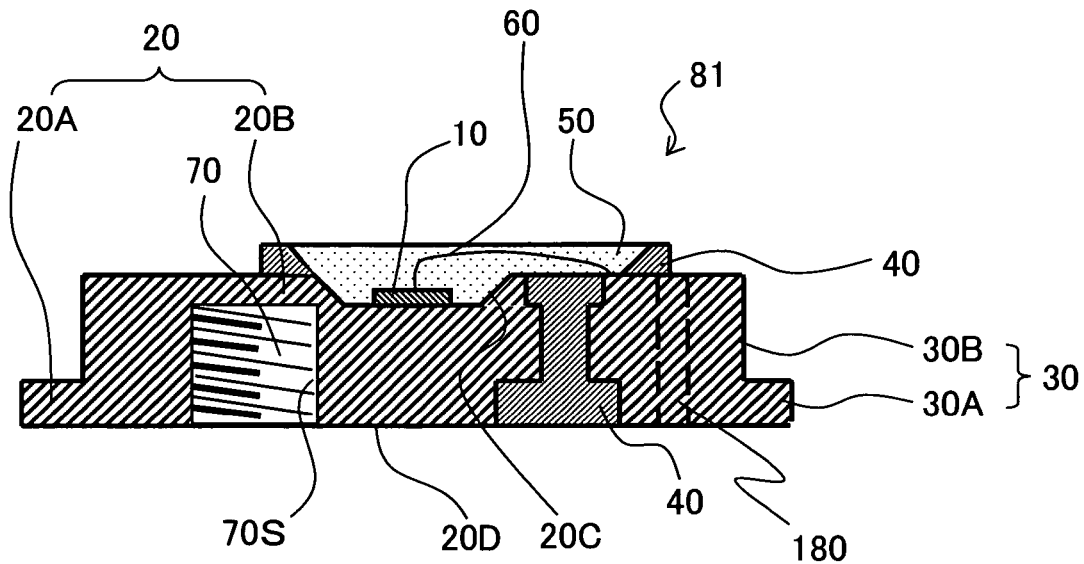
Figure 12B:
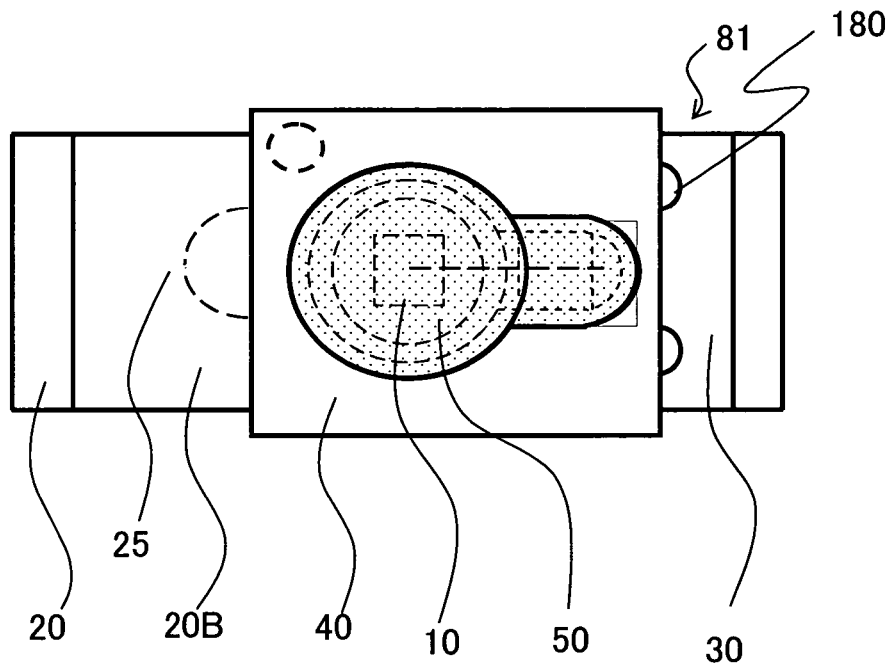

FIG. 12A is a cross sectional view of a semiconductor light emitting device in accordance with a second embodiment of the present invention. FIG. 12B is a top view of the semiconductor light emitting device in accordance with the second embodiment.

Figure 13A:
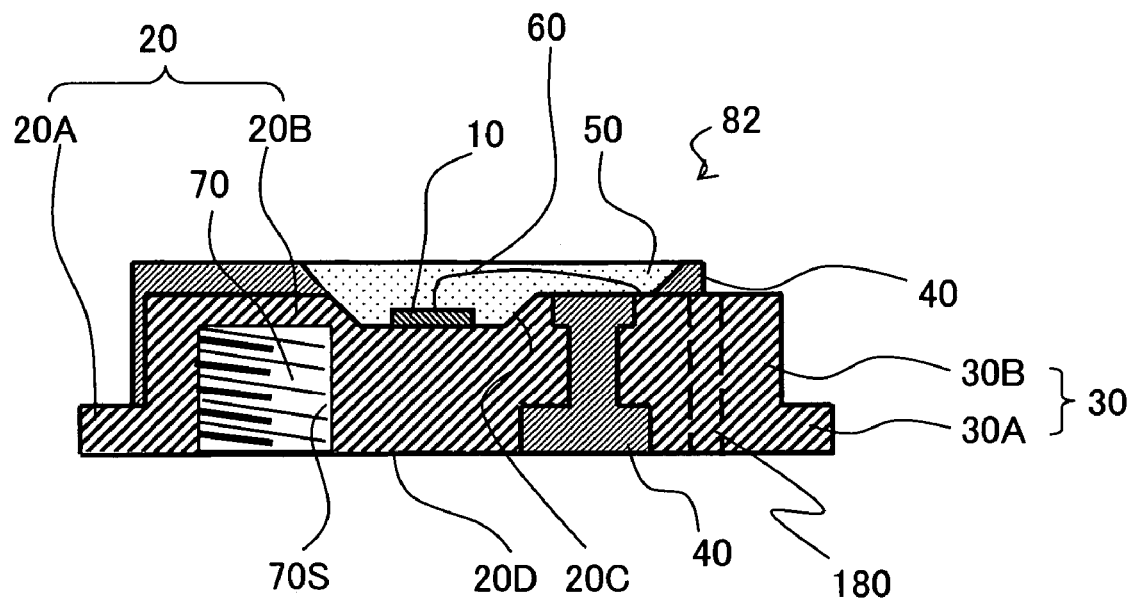
Figure 13B:
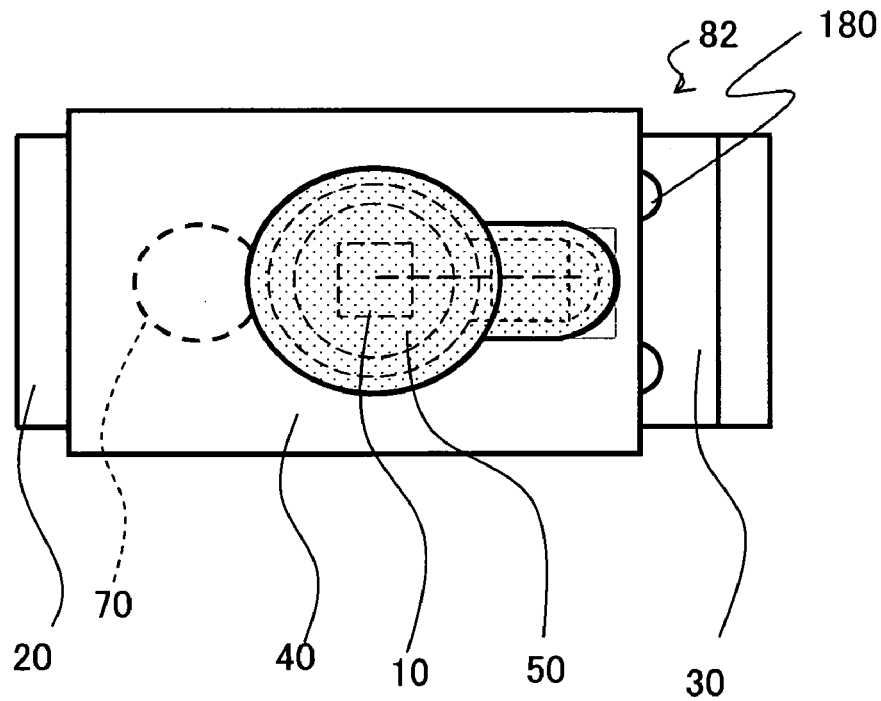

FIG. 13A is a cross sectional view of a semiconductor light emitting device in accordance with a modification of the second embodiment of the present invention. FIG. 13B is a top view of the semiconductor light emitting device in accordance with the modification of the second embodiment.

Figure 14A:
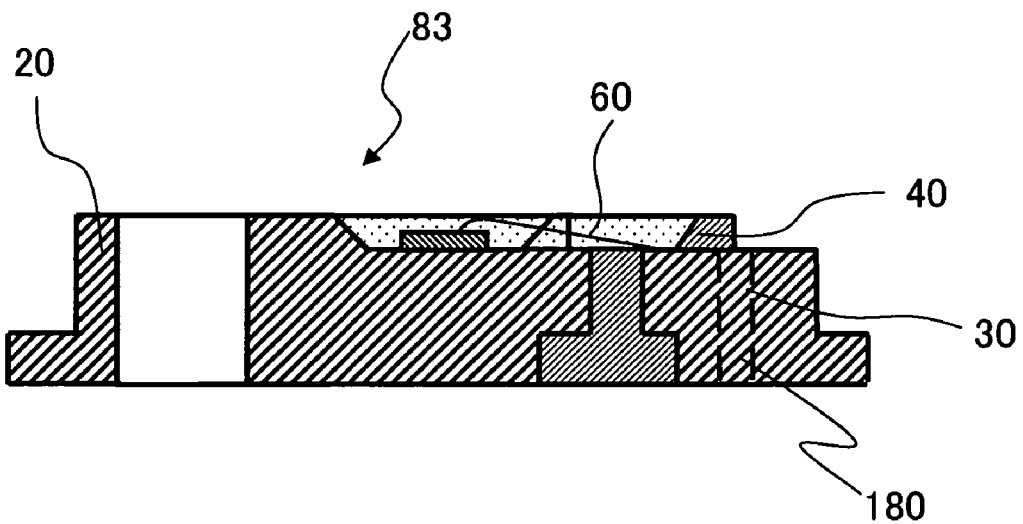
Figure 14B:
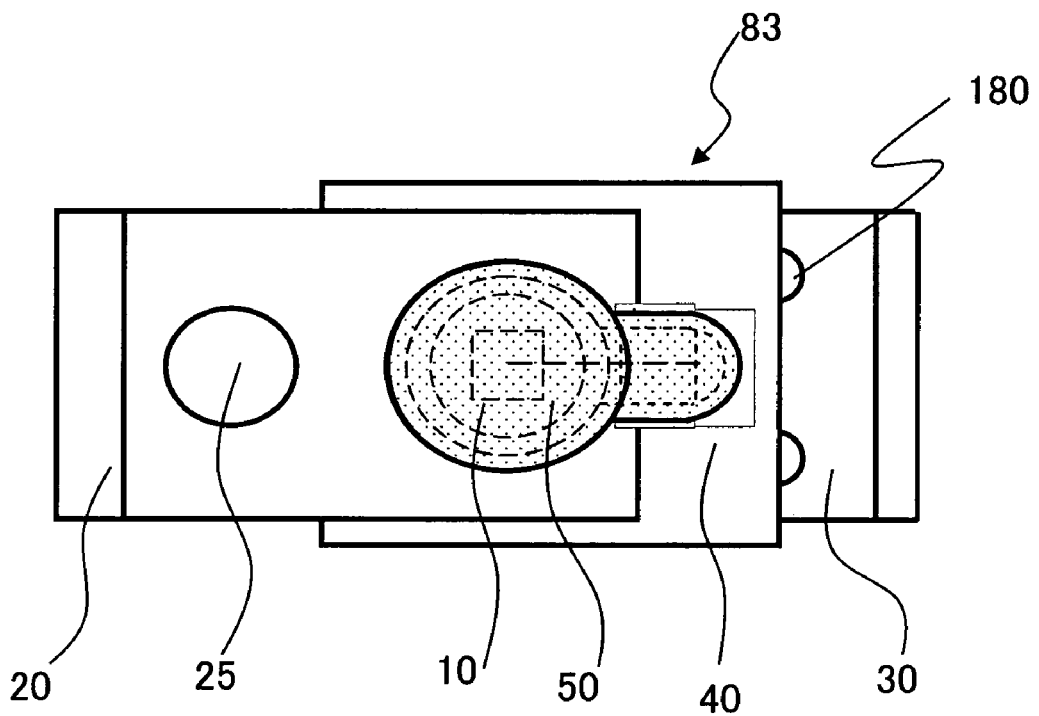

FIG. 14A is a cross sectional view of a semiconductor light emitting device in accordance with a third embodiment of the present invention. FIG. 14B is a top view of the semiconductor light emitting device in accordance with the third embodiment.

DETAILED DESCRIPTION OF THE INVENTION

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as follows.

General Overview

In one aspect of the present invention, a semiconductor light emitting device may include a mold resin having a cup shape portion on an upper surface of the mold resin; a first lead provided in the mold resin and extending from the cup shape portion to outside of the mold resin, the first lead having a first lead section and a second lead section, the second lead section of the first lead being thicker than the first lead section of the first lead, the second lead section of the first lead having a hole; a second lead provided in the mold resin and extending from the cup shape portion to outside of the mold resin, having a first lead section and a second lead section, the second lead section of the second lead being thicker than the first lead section of the second lead; a light emitting element mounted on the second section of the first lead in the cup shape portion; a wire electrically connecting the light emitting element and the second lead; and a sealing resin configured to seal the light emitting element and the wire.

In another aspect of the invention, a semiconductor light emitting device may include a mold resin having a cup shape portion on an upper surface of the mold resin; a first lead provided in the mold resin and extending from the cup shape portion to outside of the mold resin, the first lead having a first lead section and a second lead section, the second lead section of the first lead being thicker than the first lead section of the first lead; a second lead provided in the mold resin and extending from the cup shape portion to outside of the mold resin, having a first lead section and a second lead section, the second lead section of the second lead being thicker than the first lead section of the second lead; a light emitting element mounted on the second section of the first lead in the cup shape portion; a wire electrically connecting the light emitting element and the second lead; a sealing resin configured to seal the light emitting element and the wire; and means for fixing the second section of the first lead to outside part of the semiconductor light emitting device by screwing, engaging or fitting.

In one aspect of the present invention, a semiconductor light emitting device may include a substrate having a opening on an upper surface of the substrate and a conductive pattern on the upper surface of the substrate; a semiconductor light emitting device provided on the substrate, the semiconductor light emitting device including, a mold resin having a cup shape portion on an upper surface of the mold resin; a first lead provided in the mold resin and extending from the cup shape portion to outside of the mold resin, the first lead having a first lead section and a second lead section, the second lead section of the first lead being thicker than the first lead section of the first lead, the second lead section of the first lead having a hole; a second lead provided in the mold resin and extending from the cup shape portion to outside of the mold resin, having a first lead section and a second lead section, the second lead section of the second lead being thicker than the first lead section of the second lead; a light emitting element mounted on the second section of the first lead in the cup shape portion; a wire electrically connecting the light emitting element and the second lead; a sealing resin configured to seal the light emitting element and the wire; a metal board provided having a protrusion, the protrusion being provided in the opening of the substrate and in contact with the second section of the first lead; and a fixing member provided in the hole of the second section of the first lead and a part of the metal board.

First Embodiment

A first embodiment of the present invention will be explained hereinafter with reference to FIGS. 1A-4C, FIGS. 8-11.

Figure 1A:
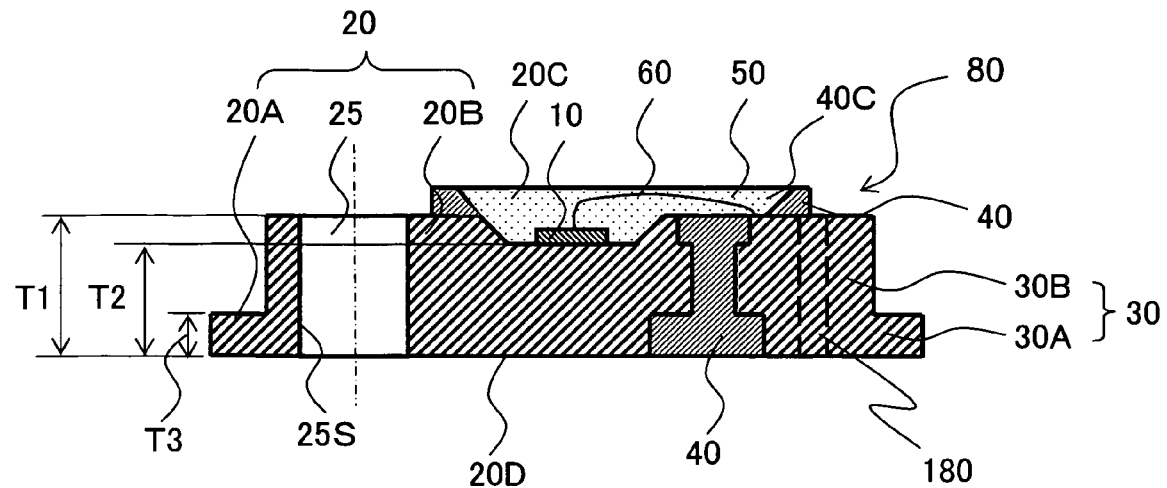
FIG. 1A is a cross sectional view of a semiconductor light emitting device in accordance with a first embodiment of the present invention.
Figure 1B:
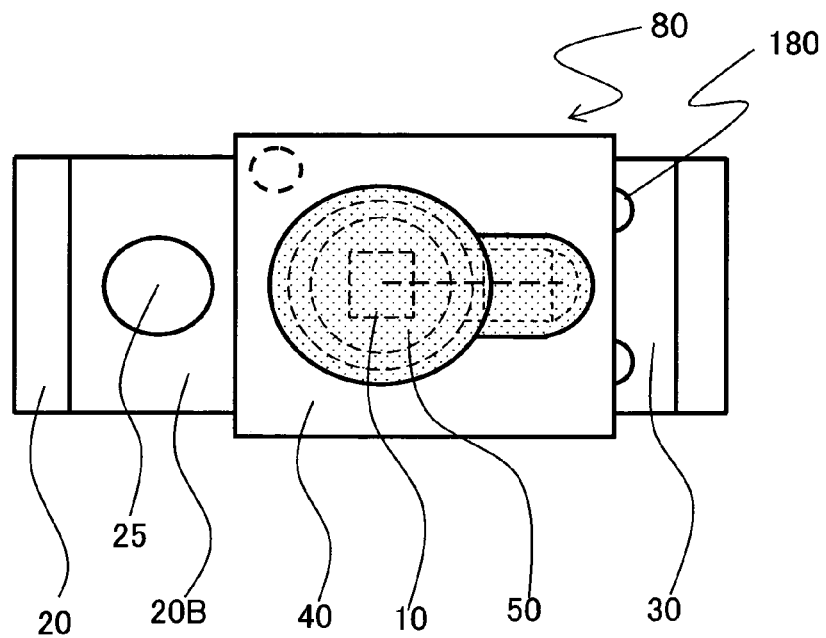
FIG. 1B is a top view of the semiconductor light emitting device in accordance with the first embodiment.

FIG. 1A is a cross sectional view of a semiconductor light emitting device 80 in accordance with a first embodiment of the present invention. FIG. 1B is a top view of the semiconductor light emitting device 80 in accordance with the first embodiment.

As shown in FIGS. 1A and 1B, the semiconductor light emitting device 80 is a SMD type semiconductor light emitting device. A pair of lead frames, which are a first lead 20 and a second lead 30, and a mold resin 40 which embeds a part of the first and the second leads 20 and 30 are provided in the semiconductor light emitting device 80. The first lead 20 has a first section 20A (thickness T3) and a second section 20B (thickness T1) which is thicker than the first section 20A. The second lead 30 has a first section 30A (thickness T3) and a second section 30B which is thicker than the first section 30A. A depressed portion 20C is provided in the second section of the first lead 20B. The depressed portion 20C of the first lead 20 has T2 in thickness of the lead. A semiconductor light emitting element 10 (abbreviated LED chip 10 hereinafter) is mounted on the depressed portion 20C of the first lead 20 with, for example, eutectic solder or conductive paste or the like.

The depressed portion 20C has a slanted inner surface, which expands to upward. The slanted inner surface may function as a reflector. The inner surface of the depressed portion 20C may be curved, such as envelope, so as to improve directivity or the ability to focus the emitted light.

A structure of the first lead 20 and the second lead 30 will be explained hereinafter.

In this embodiment, a part of the first lead 20, on which the LED chip 10 is mounted, has a greater in thickness than the first section of the first lead 20A. Namely the T2 is larger than the T3. Heat radiation efficiency is improved, since the part of the first lead 20, on which the LED chip 10 is mounted, is thick. On the other hand, the first section of the first lead 20A and the first section of the second lead 30A are thin. It is preferable that the first section of the first lead and the second lead 20A, 20B are not thick in an aspect of a lead cut process or an adhering on a substrate process.

As shown in FIGS. 1A, 1B, the second section of the first lead 20B and the second section of the second 30B have a substantially same thickness.

However, it may be available that a thickness of the second section of the first lead 20B and the second section of the second 30B is different.

A hole 25 is provided in the second section of the first lead 20B. The hole 25 is provided for fixing the semiconductor light emitting device 80 to a heat sink, such as metal board, by a fixing member. In case the fixing member is a screw and a nut, the hole 25 may penetrate through the second section of the first lead 20B. In case the female screw is provided on an inner surface 25S of the hole, the semiconductor light emitting device 80 may be fixed to the heat sink by a screw as a fixing member. In this case, the hole 25 is not penetrated through, stopped in the first lead 20, and has a bottom surface in the first lead 20.

As shown in FIG. 1A, the hole 25 is provided in the second section of the first lead 20B, which is thicker than the first section of the first lead 20A. So it may be available that the semiconductor light emitting device 80 is fixed to the heat sink strongly, since the second section of the first lead 20B, in which the hole 25 is provided, has a thicker than the first section of the first lead 20A. That is bending or deformation in the lead frame 20 is reduced by the fixing the lead frame at the thick portion, and the heat release efficiency may be improved. In case a female screw is provided in the hole 25, the required number of a trench of the female screw is capable of being provided in the hole 25, since the hole 25 is provided in the thick section 20B.

For example, the thickness of the second section of the first lead and the second lead 20B, 30B, which is T1, may be 2 mm. For example, the thickness of the part of first lead 20, which the LED chip 10 mounted on, may be 1.5 mm. For example, the thickness of the first section of the first lead and the second lead 20A, 30A, which is T3 may be 0.5 mm. In case the female screw is not provided on the inner surface of the hole 25, the thickness Ti may be thinned to about 1.2 mm.

Figures 2A, 2B:
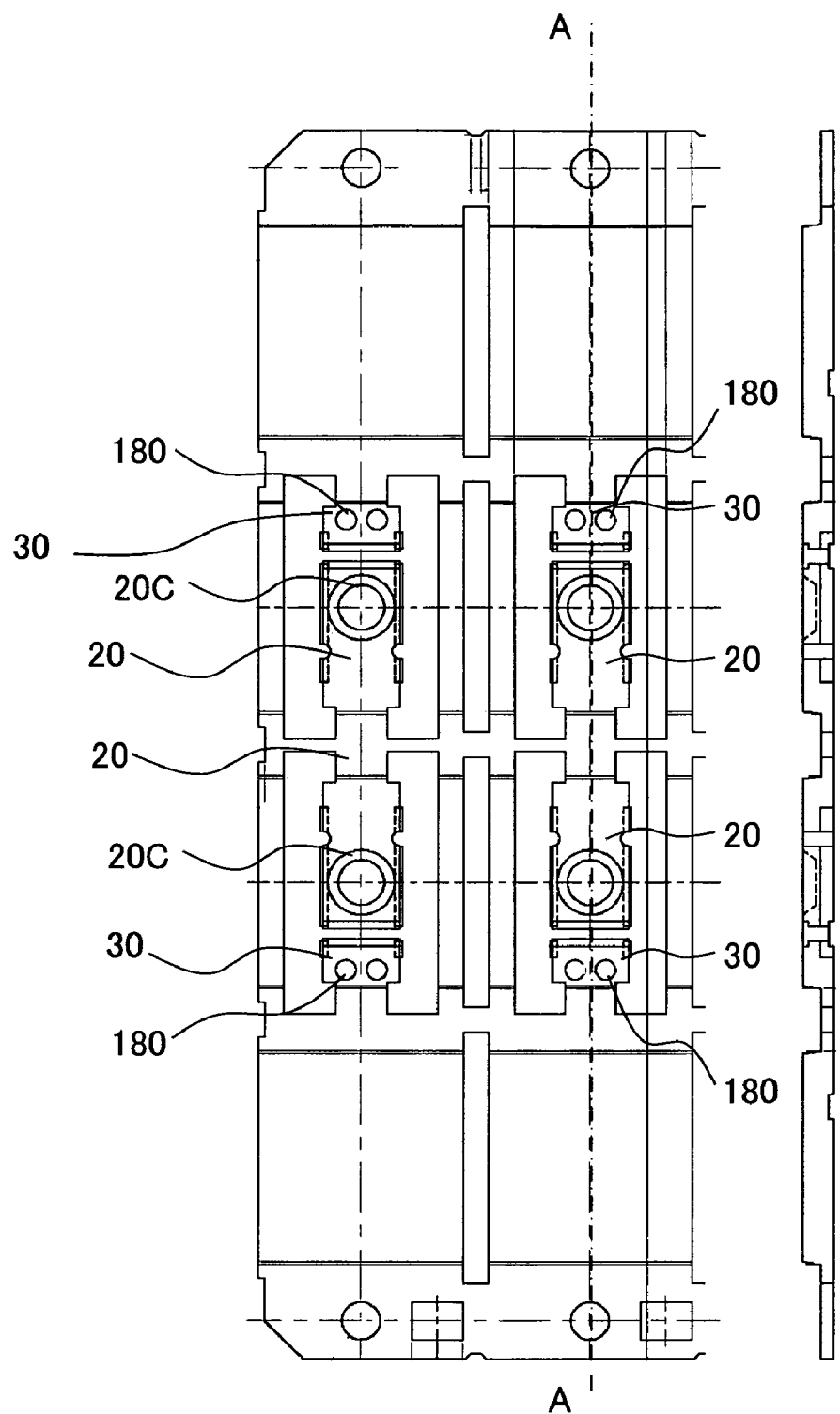
FIG. 2A is a top view of a lead frame of the semiconductor light emitting device in accordance with the first embodiment.
FIG. 2B is a cross sectional view of the lead frame taken along A-A line in FIG. 2A.

FIG. 2A is a top view of a lead frame of the semiconductor light emitting device 80 in accordance with the first embodiment. FIG. 2B is a cross sectional view of the lead frame taken along A-A line in FIG. 2A.

As shown in FIG. 2A, a lot of the leads 20 and 30 are connected to one lead frame, during a manufacturing process.

If the leads are connected to others, the number of components may be reduced and easier manufacturing process is obtained.

The first lead 20 and the second lead 30 may be made of, for example, copper based alloys. Heat release efficiency may be improved, since the copper based alloys have good heat conductance. In case a metal coating, such as plating, may be provided on the leads 20, 30, the light may be reflected by a slanted portion of the first lead 20, or it may be easier to adhere the leads 20 and 30 with a solder. A metal coating may be single layer of Ag, or multiple layer of Ni/Pd/Au.

The structure of the mold resin 40 will be explained hereinafter.

The mold resin 40 may be made of, for example, thermoplastic resin, such as Polyphthalamide or nylon based resin. In an outer size of the mold resin 40, the length may be 7 mm, the width may be 5 mm, and the height may be 2.5 mm.

Figures 3A, 3B:
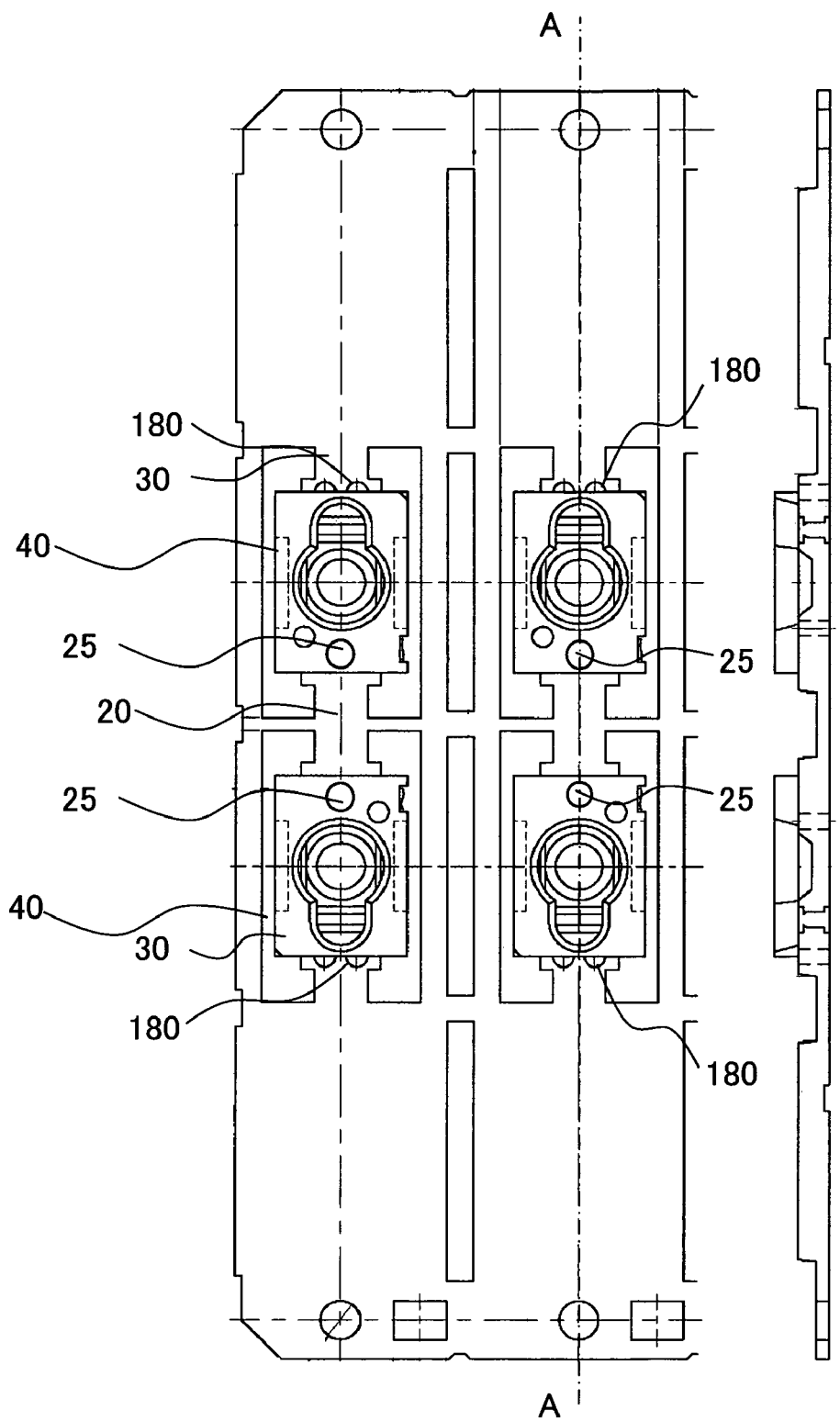
FIG. 3A is a top view of a lead frame with a mold resin of the semiconductor light emitting device in accordance with the first embodiment.
FIG. 3B is a cross sectional view of the lead frame with the mold resin taken along A-A line in FIG. 3A.

FIG. 3A is a top view of a lead frame with a mold resin of the semiconductor light emitting device in accordance with the first embodiment. FIG. 3B is a cross sectional view of the lead frame with the mold resin taken along A-A line in FIG. 3A.

As shown in FIGS. 3A, 3B, the leads 20 and 30 are embedded in the mold resin 40. The positioning accuracy of the leads 20, 30 and the mold resin 40, and the productivity is improved, since the leads 20 and 30 are in the lead frame state, It is preferable that a bottom surface 20B of the first lead 20 is exposed form the mold resin 40 to outside, so as to capable of being in contact with the heat sink, so as to improve heat release efficiency.

An adhesive strength between the leads 20, 30 and the mold resin 40 in the semiconductor light emitting device 80 will be explained.

Figure 4A:
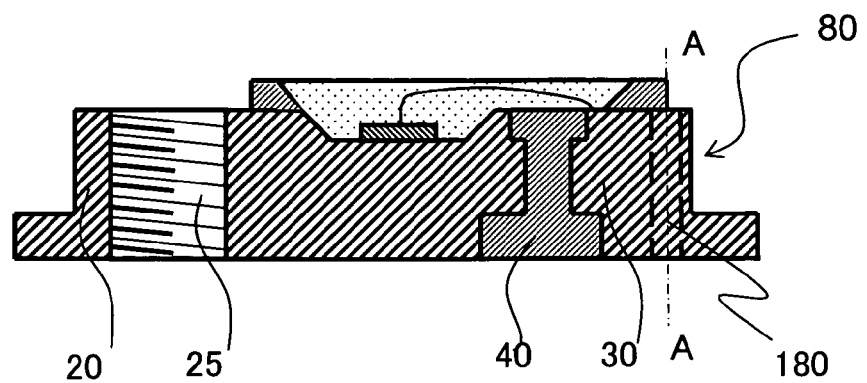
FIGS. 4A and 4C are cross sectional views of the semiconductor light emitting device of the first embodiment.
Figure 4B:
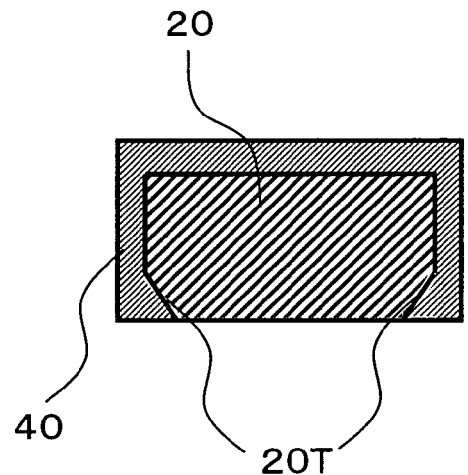
FIG. 4B is a cross sectional view of the semiconductor light emitting device taken along A-A line in FIG. 4A.
Figure 4C:
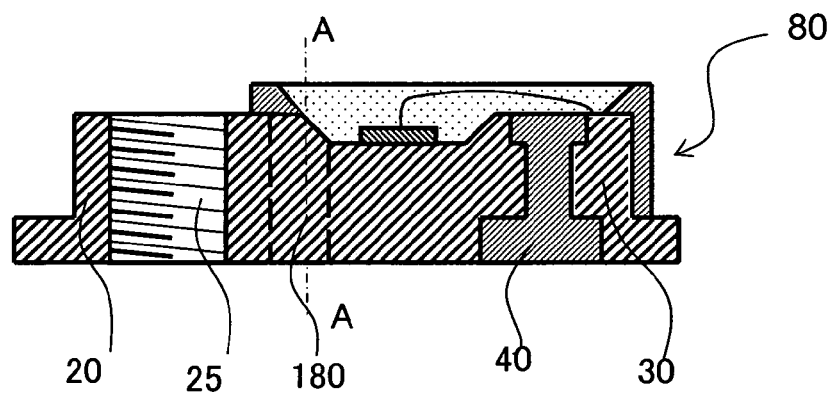

FIGS. 4A and 4C are cross sectional views of the semiconductor light emitting device of the first embodiment. FIG. 4B is a cross sectional view of the semiconductor light emitting device taken along A-A line in FIG. 4A.

In case the bottom surface of the leads 20, 30 are exposed from the mold resin 40 to outside, it is preferable that the mold resin 40 is not peeled from the leads 20, 30.

An anchor hole 180 is provided in the second section 30B of the second lead 30. The mold resin 40 is embedded in the anchor hole 180. So the adhesive strength is improved, and a contact area between the leads 20, 30 and the mold resin 40 is enlarged, and it may be difficult that the mold resin 40 is peeled from the leads 20, 30.

As shown in FIG. 4B, the anchor hole 180 may have a taper 30T or step portion. So the contact area between the lead and the mold resin is increased and the adhesion strength is improved.

As shown in FIG. 4A, a protrusion and a depression may be provided on the tip of the leads 20, 30. So the adhesion strength between the leads 20, 30 and the mold resin 40 may be improved.

In this embodiment, it may be prevented a casing for the insert forming process from being not in contact with the LED chip 10, since the LED chip 10 is provided in the depressed portion 20C of the second lead 20. Namely the mold resin 40 may be formed by an insert forming, after the LED chip 10 is mounted on the lead 20. So it may be available that the LED chip 10 is adhered to the lead 20 by eutectic solder, which has high melting point (about 280-420 Centigrade). So reliability of the semiconductor light emitting device may be improved.

A light emitting element, which emits visible light, blue light or ultraviolet light, may be used as the LED chip 10. A fluorescent material, such as phosphor may be provided in the transparent resin 50.

A semiconductor light emitting unit 300, which has the semiconductor light emitting device 80, will be explained with reference to FIGS. 8-11.

Figure 8:
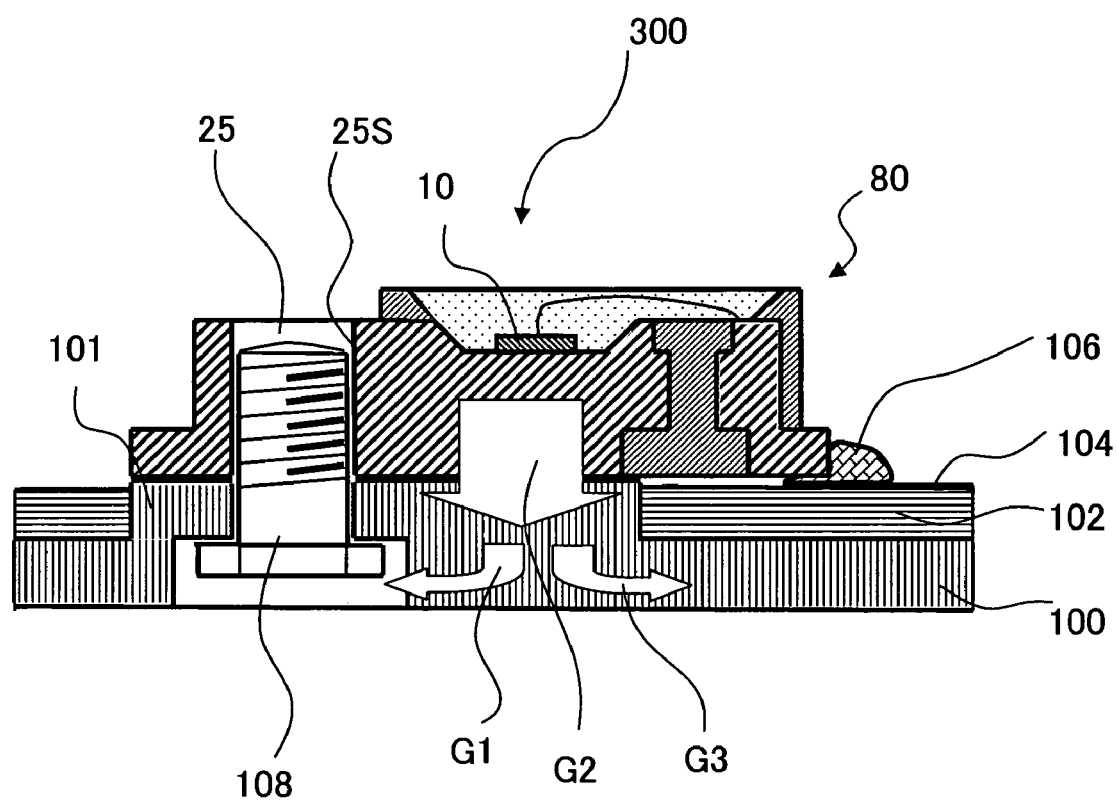
FIG. 8 is a cross sectional view of a semiconductor light emitting unit, in which the semiconductor light emitting device is mounted on a substrate, in accordance with the first embodiment.

FIG. 8 is a cross sectional view of the semiconductor light emitting unit 300, in which the semiconductor light emitting device is mounted on a substrate, in accordance with the first embodiment.

As shown in FIG. 8, in the semiconductor light emitting unit 300, a substrate 102, which is made of, for example, a glass epoxy resin, a heat sink 100, which has high heat release metal, such as Al or Cu based alloy, a fixing member 108 and the semiconductor light emitting device 80. A power supply circuit (not shown in FIG. 8) may be provided on the substrate 102. The thickness of the heat sink 100 may be preferably 0.5 mm or more, so as to obtain physical strength. The thickness of the heat sink 100 may be preferably 2 mm or more, so as to improve heat release efficiency.

The substrate 102 has an opening. The heat sink 100 has a protrusion 101 on its top surface. The protrusion 101 is inserted through the opening of the substrate 102. The protrusion 101 is in contact with the bottom surface of the first lead 20. The semiconductor light emitting device 80 and the heat sink 100 are fixed by the fixing member 108. In the semiconductor light emitting unit 300 as shown in FIG. 8, a female screw 25S is provided in the inner surface of the hole 25. Heat generated in the semiconductor light emitting device 80 is extracted to outside of the semiconductor light emitting unit 300 through the heat sink 100 as shown in arrow G1, G2, and G3.

The second lead 30 is adhered to a electrode pattern 104, which is provided on the substrate 102, with a solder 106. The solder 106 may be formed by a solder reflow process, for example.

FIG. 9A is a top view of the semiconductor light emitting unit in accordance with the first embodiment. FIG. 9B is a cross sectional view of the semiconductor light emitting unit in accordance with the first embodiment. FIG. 9C is a bottom view of the semiconductor light emitting unit in accordance with the first embodiment.

As shown in FIG. 9A, a plurality of the semiconductor light emitting device 80 is provided on the heat sink 100 and the substrate 102. Generally, in case the semiconductor light emitting device 80 is used for general lightings or automotive use, a large current, such as 500 mA or more, is injected to the LED chip 10 in order to drive the LED chip 10. In this embodiment, the semiconductor light emitting device 80 is attached to the heat sink 100. So heat efficiency is improved. In this embodiment, the semiconductor light emitting device 80 and the heat sink 100 are fixed by the fixing member 25. So heat release efficiency is improved more.

FIG. 10A is a top view of the semiconductor light emitting unit in accordance with a modification of the first embodiment. FIG. 10B is a cross sectional view of the semiconductor light emitting unit in accordance with the modification of the first embodiment. FIG. 10C is a bottom view of the semiconductor light emitting unit in accordance with the modification of the first embodiment. FIG. 11 is a perspective view of a fixing member 100 in accordance with the modification of the first embodiment.

As shown in FIG. 11, a fixing member 110 has a plurality of screw portions 112. The screw portion 112 is spaced predetermined distance, which is corresponding to a pitch of a plurality of the disposed semiconductor light emitting device 80. As shown in FIG. 10B, the semiconductor light emitting device 80 and the heat sink 100 are fixed by the fixing member 110, with the screw portion 112 of the fixing member 110 inserted into the hole 25 of the semiconductor light emitting device 80 in this case, the fixing member 110 may be inserted from the bottom surface of the semiconductor light emitting device 80 as shown in FIG. 10B, or may be inserted from the upper side of the semiconductor light emitting device 80. A fixing member, which has an opening, such as a nut 170 as shown in FIG. 10A, may be attached on a top of the screw portion 112. The fixing member 110 may be preferably made of Cu based alloy or Al. However it may be available that the fixing member 110 is made of brass or stainless steel, which has lower heat release efficiency. The fixing member 110 may be made of a insulating materials.

In this embodiment, the hole 25 is penetrating through the first lead 20.

However, the hole 25 may be not penetrating through the first lead 20. In other words, the hole 25 has a bottom surface in the first lead 20.

A comparative example of the present invention will be explained herein after with reference to FIG. 5.

Figure 5:
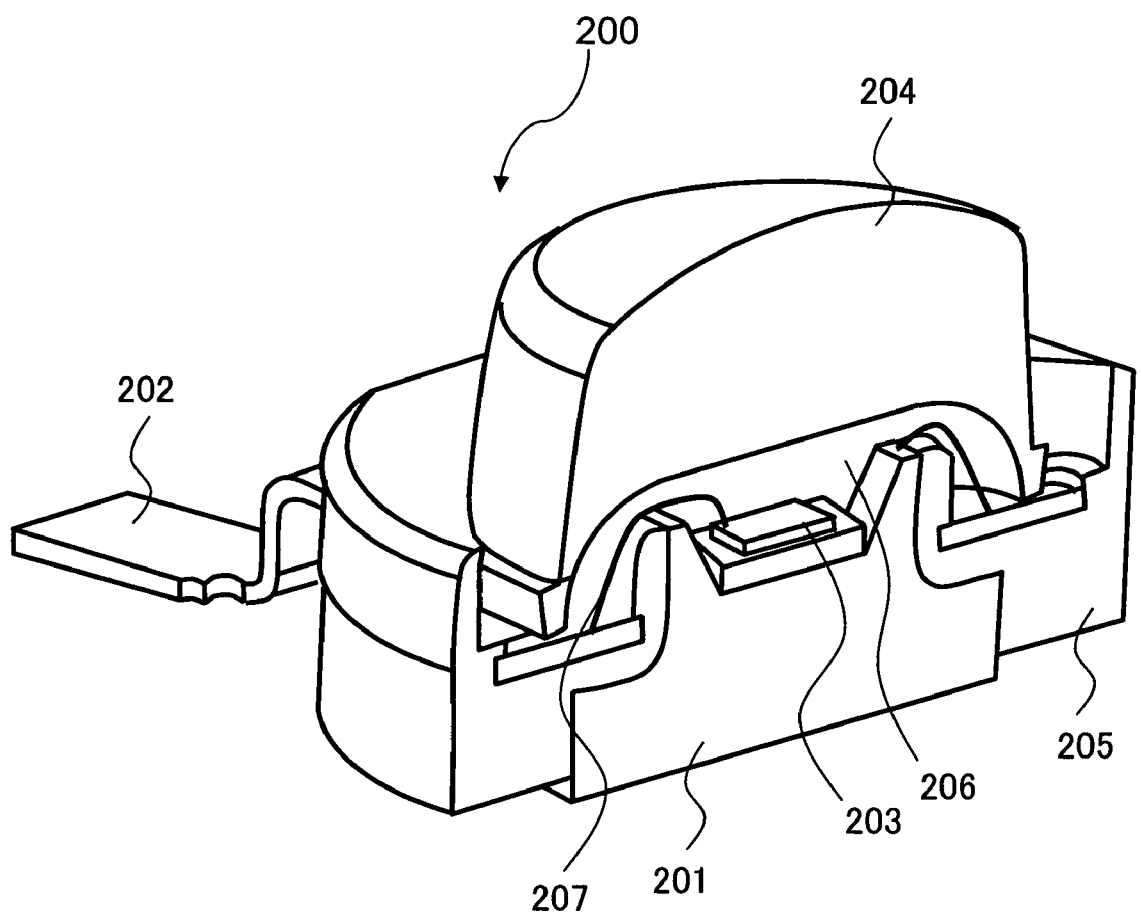
FIG. 5 is a perspective cross sectional view of a semiconductor light emitting device in accordance with a first comparative example.

FIG. 5 is a perspective cross sectional view of a semiconductor light emitting device 200 in accordance with a first comparative example.

In the semiconductor light emitting device 200 of the first comparative example, a heat sink 201, an external terminal 202, a semiconductor light emitting element (LED chip) 203, a lens 204, a mold resin 205, a transparent resin 206 and a wire 207 are provided. The heat sink 201 and the external terminal 202 are formed individually, and later connected. Metal plating is provided on a surface of the heat sink 201 and the external terminal 202. The heat sink 201 is provided in the mold resin 205. The LED chip 203 is mounted on the heat sink 201 via a conductive adhesive (e.g. Ag paste). An electrode of the LED chip 203 and the external electrode 202 are electrically connected with the wire 207. The LED chip 203 and the wire 207 are sealed by the transparent resin 206. The lens 204 is provided thereon.

A heat release efficiency of the semiconductor light emitting device 200 may be low, since a connecting portion between the heat sink 201 and the external terminal 202 does not have good heat release efficiency. That is because the heat sink 201 and the external terminal 202 are individual parts.

In the semiconductor light emitting device 200, it is necessary to position the heat sink 201 and the external terminal 202 to a metal mold during the injection mold process. Positioning two or more parts during that process is low productivity.

Near a boundary between the heat sink 201 and the external terminal 202, the mold resin 205 may be peeled off, cracked or have a burr.

A second comparative example of the present invention will be explained with reference to FIGS. 6A-7.

Figure 6A:
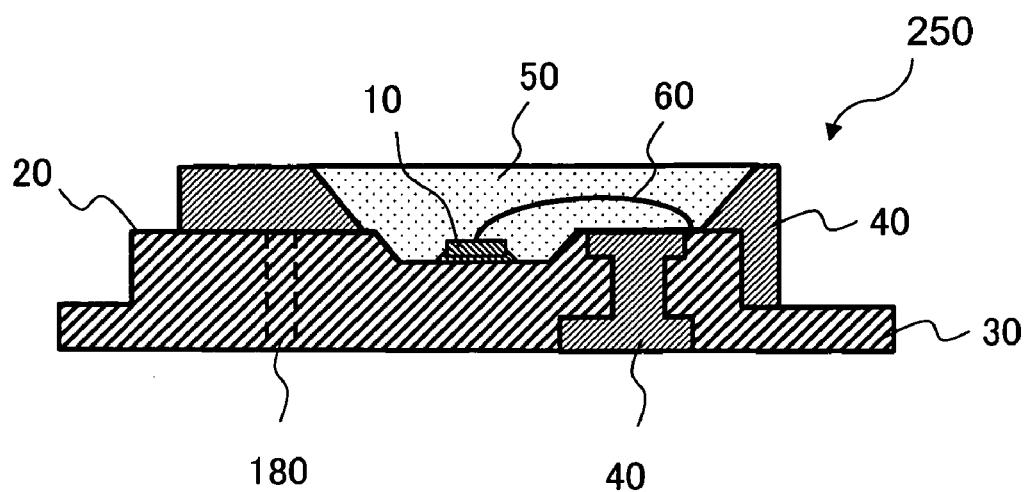
FIG. 6A is a cross sectional view of a semiconductor light emitting device in accordance with a second comparative example.
Figure 6B:
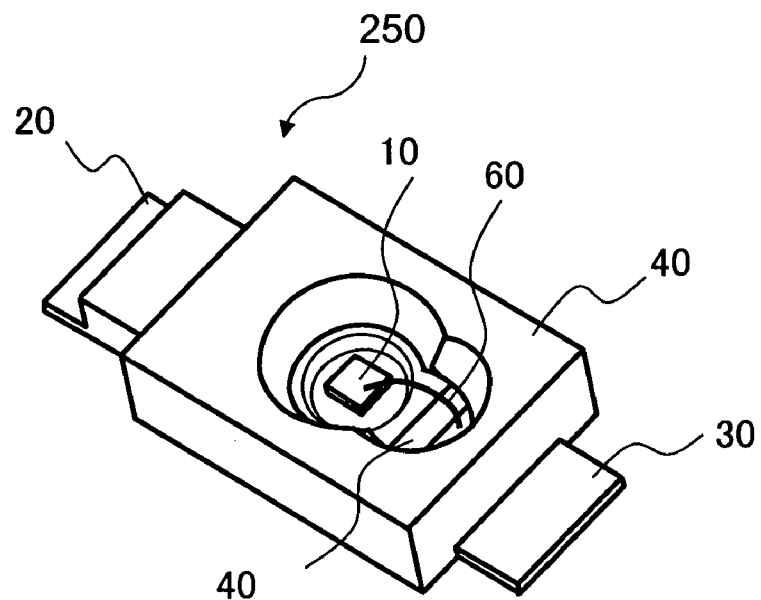
FIG. 6B is a perspective view of the semiconductor light emitting device in accordance with the second comparative example.

FIG. 6A is a cross sectional view of a semiconductor light emitting device 250 and FIG. 6B is a perspective view of the semiconductor light emitting device 250 in accordance with the second comparative example.

In this semiconductor light emitting device 250, a hole for fixing is not provided. So it is necessary for the semiconductor light emitting device 250 that to use solder, when the semiconductor light emitting device 250 is attached to a substrate 190.

Figure 7:
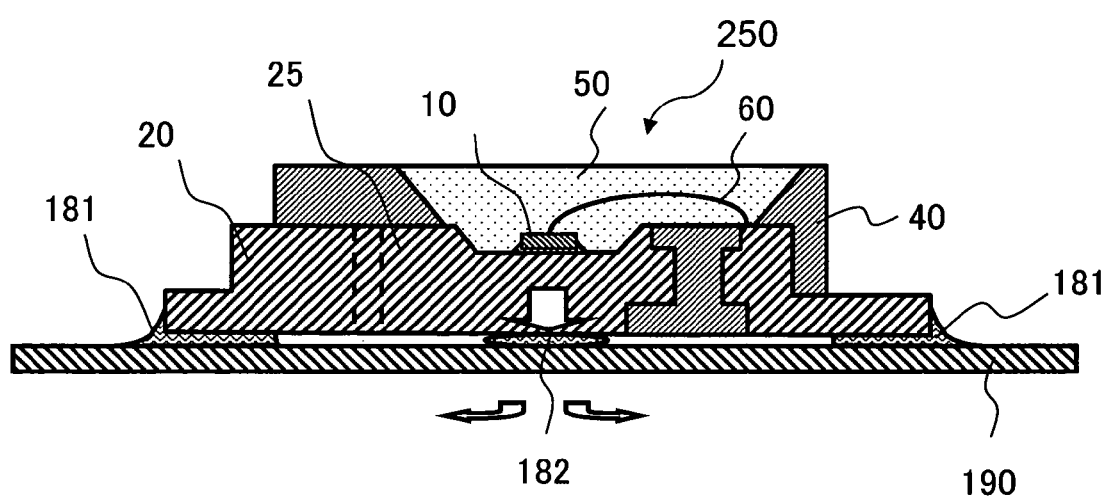
FIG. 7 is a cross sectional view of a semiconductor light emitting unit, in which the semiconductor light emitting device is mounted on a substrate, in accordance with the second comparative example.

FIG. 7 is a cross sectional view of a semiconductor light emitting unit 400, in which the semiconductor light emitting device 250 is mounted on a substrate 190, in accordance with the second comparative example.

An exposed bottom surface of the semiconductor light emitting device 250 is adhered to a conductive pattern of the substrate 190 via a solder 181. The semiconductor light emitting device 250 has a good heat release efficiency comparing with a conventional semiconductor light emitting device. However, it may be difficult to provide the solder 181 uniformly on the substrate 190. So a gap between the bottom surface of the semiconductor light emitting device 250 and the substrate 190, where the solder 181 is not provided, may be formed. The gap is an ambient gas, such as air. So the heat resistance is quite high and the gap is an obstacle for heat release.

In case a solder 182 is provided on the substrate 190 directly under the LED chip 10, the heat release efficiency may be improved. However, the gap still exists between the bottom surface of the semiconductor light emitting device 250 and the substrate 190.

With comparing to the first and second comparative examples, the semiconductor light emitting device of this embodiment may be capable of release heat efficiently.

Second Embodiment

A second embodiment is explained with reference to FIGS. 12A-13B.

A semiconductor light emitting device 81 is described in accordance with a second embodiment of the present invention. With respect to each portion of this embodiment, the same or corresponding portions of the semiconductor light emitting device of the first embodiment shown in FIGS. 1-11 are designated by the same reference numerals, and explanation of such portions is omitted.

FIG. 12A is a cross sectional view of a semiconductor light emitting device 81, and FIG. 12B is a top view of the semiconductor light emitting device 81 in accordance with the second embodiment.

As shown in FIG. 12A, a hole 70, which is provided in the second section 20 B of the first lead 20, is not penetrated through. The hole 70 is stopped in the first lead 20. A female screw 70S is provided in an inner surface of the hole 70.

A heat release efficiency is improved, since the semiconductor light emitting device 81 is capable of attaching to the heat sink 100 with the fixing member (not shown in FIGS. 12A, 12B) and the hole 70. A part of the fixing member is not provided to light extraction surface (upper surface) of the semiconductor light emitting device 81. In other words, the fixing member is stopped in the hole 70. So the fixing member may be not an obstacle of light emitting from the LED chip 10.

A modification of the second embodiment will be explained hereinafter.

FIG. 13A is a cross sectional view of a semiconductor light emitting device 82, and FIG. 13B is a top view of the semiconductor light emitting device in accordance with the modification of the second embodiment.

In this modification, the mold resin 40 is extended to the first section 20A of the first lead 20 and covers a part of an upper surface of the first section 20A of the first lead 20. The hole 70 is provided in the second section 20B of the first lead 20. The hole 70 is not penetrated through and is stopped in the first lead 20. A female screw 70S is provided in an inner surface of the hole 70.

As shown in FIG. 12A, 12B, 13A, and 13B, a size of the semiconductor light emitting device, in the plan view, is reduced, when the hole is provided under a part of the first lead 20, which the mold resin 40 covers on. So high density mount and good heat release efficiency may be obtained.

Third Embodiment

A third embodiment is explained with reference to FIGS. 14A-14B.

A semiconductor light emitting device 83 is described in accordance with a third embodiment of the present invention. With respect to each portion of this embodiment, the same or corresponding portions of the semiconductor light emitting device of the first or second embodiment shown in FIGS. 1-13B are designated by the same reference numerals, and explanation of such portions is omitted.

FIG. 14A is a cross sectional view of a semiconductor light emitting device 83, and FIG. 14B is a top view of the semiconductor light emitting device 83 in accordance with the third embodiment.

As shown in FIG. 14A, a height of the mold resin 40 is substantially equal to that of the first lead 20. An upper surface of the second lead 30 is substantially equal to a part of the first lead on which the LED chip 10 is mounted, so that the highest part of the wire 60 is not above the upper surface of the first lead 20. The transparent resin 50 is not over the height of the first lead 20. So a height of the semiconductor light emitting device 83 is reduced. Namely the semiconductor light emitting device 83, which is thin, is obtained.

In case the hole 25 is penetrated through, the fixing member is not in contact with the mold resin 40 or the transparent resin 50. So the semiconductor light emitting device 83 may be easily attached to a heat sink.

Embodiments of the invention have been described with reference to the examples. However, the invention is not limited thereto.

For example, the material of the LED chip is not limited to InGaAlP-based or GaN-based semiconductors, but may include various other Group III-V compound semiconductors such as GaAlAs-based and InP-based semiconductors, or Group II-VI compound semiconductors, or various other semiconductors.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor light emitting device, comprising:
   a mold resin having a cup shape portion on an upper surface of the mold resin;
   a first lead provided in the mold resin and extending from the cup shape portion to outside of the mold resin, the first lead having a first lead section and a second lead section, the second lead section of the first lead being thicker than the first lead section of the first lead, the second lead section of the first lead having a hole;
   a second lead provided in the mold resin and extending from the cup shape portion to outside of the mold resin, having a first lead section and a second lead section, the second lead section of the second lead being thicker than the first lead section of the second lead;
   a light emitting element mounted on the second section of the first lead in the cup shape portion;
   a wire electrically connecting the light emitting element and the second lead; and
   a sealing resin configured to seal the light emitting element and the wire,
   wherein the first and second lead sections of the first lead and the first and second lead sections of the second lead each having a substantially coplanar rear face, and
   wherein at least a part of the rear face of the first lead section of the first lead and at least a part of the rear face of the first lead section of the second lead being not covered with the embedding resin but being exposed.

2. A semiconductor light emitting device of claim 1, wherein a female screw is provided on an inner surface of the hole.

3. A semiconductor light emitting device of claim 1, wherein the hole is provided in a part of the second section of the first lead and the mold resin is not provided on the part.

4. A semiconductor light emitting device of claim 1, wherein a bottom surface of the second section of the first lead is exposed from the mold resin.

5. A semiconductor light emitting device of claim 1, wherein a third section of the first lead is provided in the second section of first lead, and is thicker than the first section of the first lead and thinner than the second section of the first lead, and the light emitting element is mounted on the third section of the first lead.

6. A semiconductor light emitting device of claim 1, wherein a contact area between the second lead and the mold resin is larger than a contact area between the first lead and the mold resin, and the second lead has a hole embedded by the mold resin.

7. A semiconductor light emitting device of claim 6, wherein the hole in the second lead is provided in a boundary between a part covered with the mold resin and a part not covered with the mold resin.

8. A semiconductor light emitting unit, comprising:
   a substrate having an opening on an upper surface of the substrate and a conductive pattern on the upper surface of the substrate;
   a semiconductor light emitting device provided on the substrate, the semiconductor light emitting device including,
      a mold resin having a cup shape portion on an upper surface of the mold resin;
      a first lead provided in the mold resin and extending from the cup shape portion to outside of the mold resin, the first lead having a first lead section and a second lead section, the second lead section of the first lead being thicker than the first lead section of the first lead, the second lead section of the first lead having a hole;
      a second lead provided in the mold resin and extending from the cup shape portion to outside of the mold resin, having a first lead section and a second lead section, the second lead section of the second lead being thicker than the first lead section of the second lead;
      a light emitting element mounted on the second section of the first lead in the cup shape portion;
      a wire electrically connecting the light emitting element and the second lead;
      a sealing resin configured to seal the light emitting element and the wire;
   a board provided having a protrusion, the protrusion being provided in the opening of the substrate and in contact with the second section of the first lead; and
   a fixing member provided in the hole of the second section of the first lead and a part of the board,
   wherein the first and second lead sections of the first lead and the first and second lead sections of the second lead each having a substantially coplanar rear face, and
   wherein at least a part of the rear face of the first lead section of the first lead and at least a part of the rear face of the first lead section of the second lead being not covered with the embedding resin but being exposed.

9. A semiconductor light emitting unit of claim 8, wherein said board is a metal board.

10. A semiconductor light emitting unit of claim 8, wherein a female screw is provided on an inner surface of the hole.

11. A semiconductor light emitting unit of claim 8, wherein the hole is provided in a part of the second section of the first lead and the mold resin is not provided on the part.

12. A semiconductor light emitting unit of claim 8, wherein a bottom surface of the second section of the first lead is exposed from the mold resin.

13. A semiconductor light emitting device of claim 12, wherein a bottom surface of the first lead and the second lead are provided on a substantially same plane.

14. A semiconductor light emitting device, comprising:
- a mold resin having a cup shape portion on an upper surface of the mold resin;
- a first lead provided in the mold resin and extending from the cup shape portion to outside of the mold resin, the first lead having a first lead section and a second lead section, the second lead section of the first lead being thicker than the first lead section of the first lead;
- a second lead provided in the mold resin and extending from the cup shape portion to outside of the mold resin, having a first lead section and a second lead section, the second lead section of the second lead being thicker than the first lead section of the second lead;
- a light emitting element mounted on the second section of the first lead in the cup shape portion;
- a wire electrically connecting the light emitting element and the second lead;
- a sealing resin configured to seal the light emitting element and the wire; and
- means for fixing the second section of the first lead to a part outside of the semiconductor light emitting device, wherein the first and second lead sections of the first lead and the first and second lead section of the second lead each having a substantially coplanar rear face, and at least a part of the rear face of the first lead section of the first lead and at least a part of the rear face of the first lead section of the second lead being not covered with the embedding resin but being exposed.

15. A semiconductor light emitting device of claim 14, wherein a hole is provided in a part of the second section of the first lead and the mold resin is not provided on the part.

16. A semiconductor light emitting device of claim 14, wherein a bottom surface of the second section of the first lead is exposed from the mold resin.

17. A semiconductor light emitting device of claim 14, wherein a third section of the first lead is provided in the second section of first lead, and is thicker than the first section of the first lead and thinner than the second section of the first lead, and the light emitting element is mounted on the third section of the first lead.

18. A semiconductor light emitting device of claim 14, wherein said means for fixing includes screwing one of said first lead relative to said part.

19. A semiconductor light emitting device of claim 14, wherein said means for fixing includes engaging one of said first lead relative to said part.

20. A semiconductor light emitting device of claim 14, wherein said means for fixing includes fitting one of said first lead relative to said part.

* * * * *